(12) United States Patent
Tsai et al.

(10) Patent No.: US 8,772,802 B2
(45) Date of Patent: Jul. 8, 2014

(54) LIGHT EMITTING DEVICE WITH TRANSPARENT PLATE

(75) Inventors: Shin-Chang Tsai, Taipei (TW);
Chia-Hao Liang, Taipei (TW);
Pei-Husan Chen, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

(21) Appl. No.: 12/610,371

(22) Filed: Nov. 2, 2009

(65) Prior Publication Data
US 2010/0207143 A1 Aug. 19, 2010

(30) Foreign Application Priority Data

Feb. 18, 2009 (TW) .............................. 98105180 A

(51) Int. Cl.
*H01L 33/00* (2010.01)
(52) U.S. Cl.
USPC ................................. 257/98; 257/81; 362/245
(58) Field of Classification Search
USPC ........ 257/79, 81, 88, 103, E33.023, E33.047, 257/E33.067, 98, E33.069; 362/245
See application file for complete search history.

(56) References Cited

U.S. PATENT DOCUMENTS

| D173,157 | S | 10/1954 | Hurley |
| 2,736,097 | A | 2/1956 | Coleman, Jr. |
| 2,913,576 | A | 11/1959 | Gilleard |
| D209,534 | S | 12/1967 | eisenberg |
| 3,780,286 | A | 12/1973 | Alexieff et al. |
| 4,935,665 | A | 6/1990 | Murata |
| D329,102 | S | 9/1992 | Dieperink |
| D334,077 | S | 3/1993 | Dieperink et al. |
| D365,409 | S | 12/1995 | Lu |
| 5,836,676 | A | 11/1998 | Ando et al. |
| 6,496,162 | B2 | 12/2002 | Kawakami et al. |
| D486,262 | S | 2/2004 | Chen |

(Continued)

FOREIGN PATENT DOCUMENTS

| CN | 1684278 | 10/2005 |
| CN | 2735164 | 10/2005 |

(Continued)

OTHER PUBLICATIONS

"Search Report of Europe Counterpart Applicationof co-pending application" issued on May 26, 2010, p. 1-p. 7.

(Continued)

*Primary Examiner* — David Vu
(74) *Attorney, Agent, or Firm* — Jianq Chyun IP Office

(57) ABSTRACT

A light emitting device includes a carrier, a light emitting element disposed and electrically connected to the carrier, and a transparent plate disposed on the carrier and including a flat-portion and a lens-portion. The lens-portion covers the light emitting element and has a light incident surface, a light emitting surface, a first side surface and a second side surface. The light emitting element is suitable for emitting a light beam. A first partial beam of the light beam passes through the light incident surface and leaves from the light emitting surface. A second partial beam of the light beam passes through the light incident surface and is transmitted to the first side surface or the second side surface, and the first side surface or the second side surface reflects at least a part of the second partial beam of the light beam to be passed through the light emitting surface.

19 Claims, 15 Drawing Sheets

(56) References Cited

U.S. PATENT DOCUMENTS

| | | | |
|---|---|---|---|
| 6,837,605 B2 | 1/2005 | Reill | |
| D517,725 S | 3/2006 | Egawa et al. | |
| 7,360,923 B2 | 4/2008 | Weber-Rabsilber et al. | |
| D606,703 S | 12/2009 | Sugishita et al. | |
| 7,659,552 B2 * | 2/2010 | Chang | 257/98 |
| D615,240 S | 5/2010 | Sugishita et al. | |
| D618,384 S | 6/2010 | Chen et al. | |
| D619,752 S | 7/2010 | Zhang | |
| 7,841,750 B2 * | 11/2010 | Wilcox et al. | 362/334 |
| D646,015 S | 9/2011 | Chiang et al. | |
| 2002/0012247 A1 | 1/2002 | Kamiya et al. | |
| 2002/0060316 A1 * | 5/2002 | Matsuyama | 257/12 |
| 2006/0007553 A1 | 1/2006 | Bogner et al. | |
| 2006/0071245 A1 | 4/2006 | Zhang | |
| 2006/0124953 A1 | 6/2006 | Negley et al. | |
| 2007/0019409 A1 | 1/2007 | Nawashiro et al. | |
| 2007/0114549 A1 | 5/2007 | Yu | |
| 2007/0114551 A1 | 5/2007 | Kawaguchi et al. | |

FOREIGN PATENT DOCUMENTS

| | | | |
|---|---|---|---|
| CN | 1698202 | | 11/2005 |
| CN | 1776478 A | | 5/2006 |
| CN | 101169232 A | | 4/2008 |
| CN | 201190931 | | 2/2009 |
| CN | 101408286 | | 4/2009 |
| CN | 101463989 | | 6/2009 |
| CN | 201368346 | | 12/2009 |
| CN | 100585268 | | 1/2010 |
| CN | 101625092 | | 1/2010 |
| CN | 201382339 | | 1/2010 |
| DE | 19623881 | | 12/1997 |
| DE | 202009014892 | | 4/2010 |
| EP | 0976589 | | 2/2000 |
| EP | 1045453 | | 10/2000 |
| JP | S59-126051 | | 7/1984 |
| JP | S52-113194 | | 9/1997 |
| JP | H09-297560 | | 11/1997 |
| JP | D1081523 | | 7/2000 |
| JP | 2005-093622 | | 4/2005 |
| JP | 2006-054407 | | 2/2006 |
| JP | 2006-147536 | | 6/2006 |
| JP | 2006-156662 | | 6/2006 |
| JP | 2006-286608 | | 10/2006 |
| JP | 2007-188669 A | | 7/2007 |
| JP | 2007-227410 | | 9/2007 |
| JP | 2008-071560 | | 3/2008 |
| JP | 2008-270144 | | 11/2008 |
| JP | 2008-282736 A | | 11/2008 |
| KR | 100742095 | * | 1/2007 |
| TW | 220416 | | 2/1994 |
| TW | 236537 | | 12/1994 |
| TW | 236538 | | 12/1994 |
| TW | 552069 | | 9/2003 |
| TW | I241040 | | 10/2005 |
| TW | I246576 | | 1/2006 |
| TW | M349984 | | 2/2009 |
| TW | M352632 | | 3/2009 |
| TW | M358259 | | 6/2009 |
| TW | D129620 | | 7/2009 |
| TW | M381863 | | 6/2010 |
| WO | WO2006089450 | * | 2/2006 |
| WO | 2006089450 | | 8/2006 |
| WO | 2008139362 A1 | | 11/2008 |
| WO | 2010084820 | | 7/2010 |

OTHER PUBLICATIONS

"Notice of Allowance of Taiwan Counterpart Application of co-pending application", issued on Nov. 18, 2010, p. 1-p. 4.

"Search Report of counterpart European application", issued on May 6, 2010, p. 1-p. 7.

"Search Report of Europe Counterpart Application" issued on Jul. 15, 2010, p. 1-p. 8.

"Search Report of European Counterpart Application", issued on Jun. 20, 2013, p. 1-p. 9.

"Fourth Office Action of China Counterpart Application", issued on Jul. 31, 2013, p. 1-p. 12.

"Notice of Allowance of U.S. counterpart application" issued on Jun. 16, 2011, p. 1-p. 16.

"Office Action of U.S. Appl. No. 12/703,201", issued on Apr. 5, 2012, pp. 1-8.

"Office Action of Taiwan counterpart application" issued on May 29, 2012, p. 1-p. 7.

"Office Action of Japan counterpart application" issued on Oct. 1, 2013, p. 1-p. 2.

* cited by examiner

LIGHT EMITTING DEVICE WITH TRANSPARENT PLATE

CROSS-REFERENCE TO RELATED APPLICATION

This application claims the priority benefit of Taiwan application serial no. 98105180, filed Feb. 18, 2009. The entirety of the above-mentioned patent application is hereby incorporated by reference herein and made a part of specification.

BACKGROUND OF THE INVENTION

1. Field of the Invention

The present invention relates to a light emitting device, more particularly, to a light emitting device with a better light emitting uniformity and efficiency.

2. Description of Related Art

A light emitting diode (LED) is a light emitting element constituted by a semiconductor material having group III-V elements. The LED has advantages such as long service life, small volume, high shock resistance, low heat output, and low power consumption. Thus, it has been widely utilized in indicators or light sources for household appliances and various instruments. In recent years, the LED has been developed towards multicolor and high brightness; therefore, its application scope has been expanded to large outdoor display boards, traffic signal lights, and the like. In the future, the LED may even become the main illumination light source with both power-saving and environment-protecting functions.

In the designs of conventional LED illumination modules, the light beam emitted by the LED is projected directly. In other words, the light beam generated by the LED has high directivity, and thus may result in unfavorable light uniformity and glares that would cause discomfort of the user. Moreover, when the LEDs of multiple colors are combined, as the light from these LEDs is emitted forward directly, a large light mixing area is needed to harmonize the light. The size of the whole LED illumination device is increased as a consequence, which causes inconvenience.

To resolve the aforementioned problems, optical glass is usually cooperated in the current LED illumination modules, so that the light beam emitted by the LED can be utilized effectively. However, if the optical glass is covered on the LED, then an illumination angle generated by the entire LED illumination module may be too small or focused at a certain region, while even having problems such as non-uniform light or low color render index of the light source.

SUMMARY OF THE INVENTION

The present invention provides a light emitting device, which includes a transparent plate for enhancing the light emitting uniformity of the light emitting device.

The present invention provides a light emitting device, which includes a carrier, a light emitting element, and a transparent plate. The light emitting element is disposed and electrically connected to the carrier. The transparent plate is disposed on the carrier. The transparent plate includes a flat-portion and a lens-portion. The flat-portion has an upper surface and a lower surface which is relative to the upper surface. Moreover, the lower surface is directly disposed on the carrier. The lens-portion covers the light emitting element, and has a light incident surface, a light emitting surface that is relative to the light incident surface, and a first side surface and a second side surface connecting the upper surface and the light emitting surface. The light emitting element is suitable for emitting a light beam. Moreover, a first partial beam of the light beam passes through the light incident surface and leaves from the light emitting surface. A second partial beam of the light beam passes through the light incident surface and is transmitted to the first side surface or the second side surface. The first side surface or the second side surface reflects at least a part of the second partial beam of the light beam to be passed through the light emitting surface.

According to an embodiment of the present invention, the first side surface and the second side surface are planes.

According to an embodiment of the present invention, tilting angles of the first side surface and the second side surface relative to the upper surface are substantially different or the same.

According to an embodiment of the present invention, the first side surface and the second side surface are respectively a plane and a curved surface.

According to an embodiment of the present invention, the light incident surface is a curved surface concaving towards the light emitting surface.

According to an embodiment of the present invention, a material of the transparent plate includes polymethyl methacrylate (PMMA).

According to an embodiment of the present invention, the transparent plate is disposed on the carrier by adhering, screwing, or locking.

According to an embodiment of the present invention, the flat portion of the transparent plate further includes a trench, which is disposed around the lower surface, and the trench is disposed around the light emitting element.

According to an embodiment of the present invention, a waterproof gel layer is disposed within the trench.

According to an embodiment of the present invention, the light emitting element includes a surface mount device (SMD) LED. The present invention further provides a light emitting device, which includes a carrier, a light emitting element, and a transparent plate. The light emitting element is disposed and electrically connected to the carrier. The transparent plate is disposed on the carrier. The transparent plate includes a flat-portion and a lens-portion. The flat-portion has an upper surface and a lower surface that is relative to the upper surface. Moreover, the lower surface of the flat-portion is directly disposed on the carrier. The lens-portion covers the light emitting element and has a light incident surface, and a side surface and a positive camber that are connected to the upper surface. The light emitting element is suitable for emitting a light beam. A first partial beam of the light beam passes through the light incident surface and leaves the positive camber. Moreover, a second partial beam of the light beam passes through the light incident surface and is transmitted to the side surface. The side surface reflects at least a part of the second partial beam of the light beam to be passed through the positive camber.

According to an embodiment of the present invention, the light incident surface is a curved surface concaving towards the positive camber.

According to an embodiment of the present invention, a curvature of the light incident surface and a curvature of the positive camber are substantially different.

According to an embodiment of the present invention, a material of the transparent plate includes PMMA.

According to an embodiment of the present invention, the transparent plate is disposed on the carrier by adhering, screwing, or locking.

According to an embodiment of the present invention, the flat portion of the transparent plate further includes a trench, which is disposed around the lower surface, and the trench is circularly disposed around the light emitting element.

According to an embodiment of the present invention, a waterproof gel layer is disposed within the trench.

According to an embodiment of the present invention, the light emitting element includes a SMD LED.

In light of the foregoing, the present invention covers the light emitting element with the lens-portion of the transparent plate, so that the first partial beam of the light beam emitted by the light emitting element passes through the light incident surface and the light emitting surface with different curvatures. The second partial beam of the light beam passes through the light incident surface and is transmitted to a cut-off surface. Moreover, the cut-off surface allows a part of the second partial beam to passes through the light emitting surface. Therefore, not only are the light intensity and the light emitting uniformity of the light emitting device enhanced, but the illuminance distribution of the light emitting element can also be controlled through the cut-off surface. Also, the occurrence of glares and double-visions can be prevented for the light emitting device to achieve a better illumination effect.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
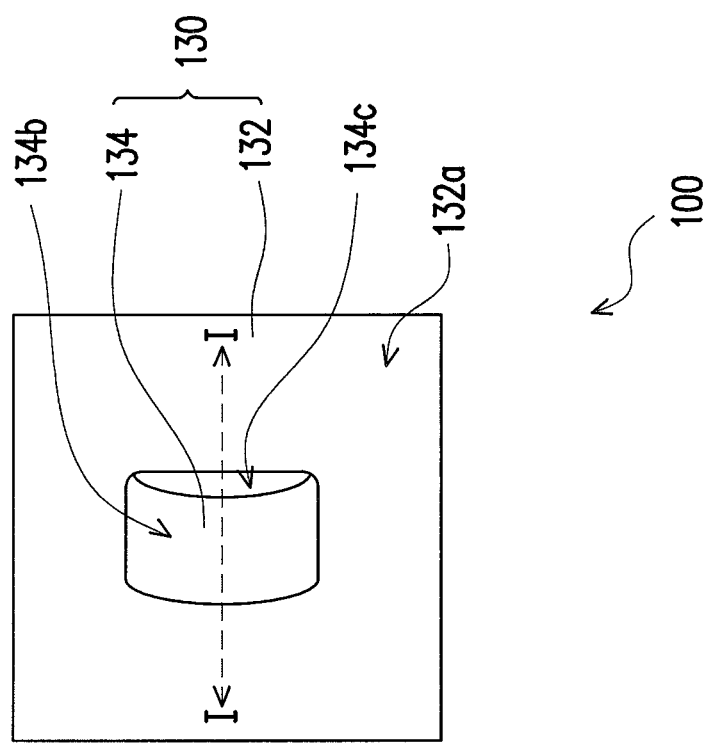
FIG. 1A is a schematic top view of a light emitting device according to an embodiment of the present invention.
Figure 1B:
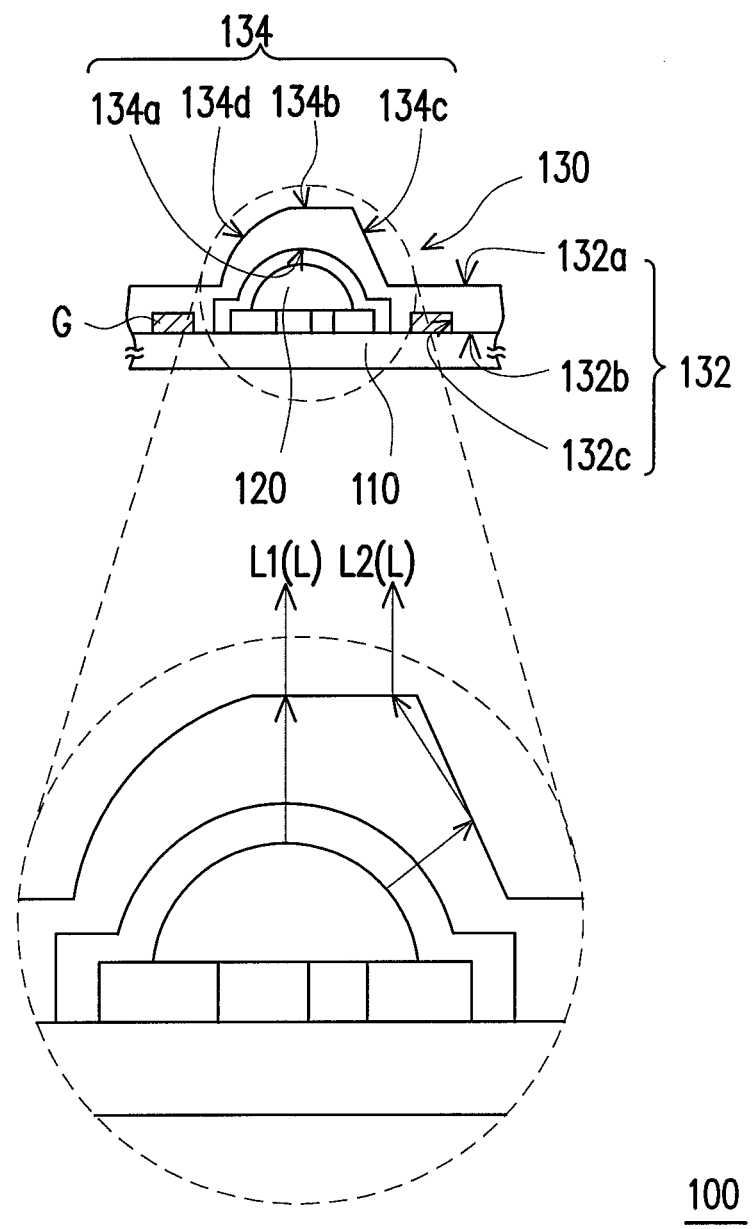
FIG. 1B is a schematic side view taken along line I-I in FIG. 1A.
Figure 1C:
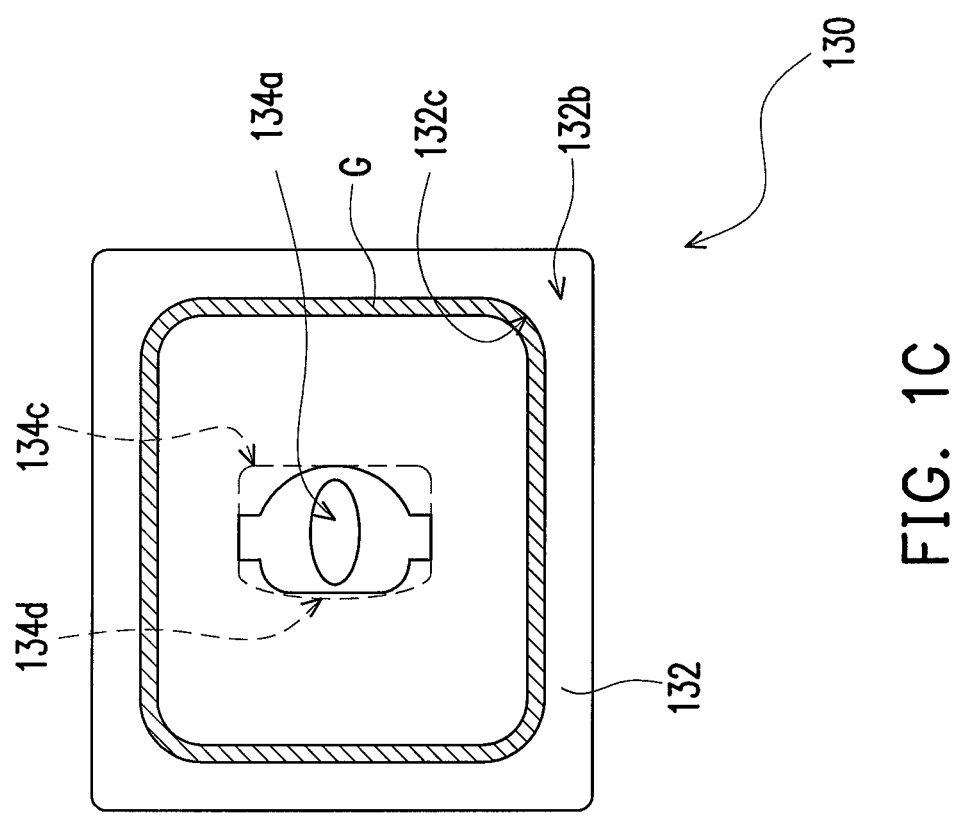
FIG. 1C is a schematic back-side view of the transparent plate depicted in FIG. 1A.

FIG. 1A is a schematic top view of a light emitting device according to an embodiment of the present invention. FIG. 1B is a schematic side view taken along line I-I in FIG. 1A. FIG. 1C is a schematic back-side view of the transparent plate depicted in FIG. 1A. Referring to FIG. 1A, FIG. 1B, and FIG. 1C simultaneously, in the present embodiment, a light emitting device 100 includes a carrier 110, a light emitting element 120, and a transparent plate 130.

In details, the light emitting element 120 is disposed and electrically connected to the carrier 110. In the present embodiment, the light emitting element 120 is a light emitting diode (LED), and more specifically, this LED is a surface mount device (SMD) LED.

The transparent plate 130 is disposed on the carrier 110 and covers the light emitting element 120. Moreover, the transparent plate 130 includes a flat-portion 132 and a lens-portion 134, which is connected to the flat-portion 132. The flat-portion 132 has an upper surface 132a, a lower surface 132b that is relative to the upper surface 132a, and a trench 132c, which is disposed around the lower surface 132b. Herein, the lower surface 132b of the flat-portion 132 is directly disposed on the carrier 110, and the trench 132c is circularly disposed around the light emitting element 120. Moreover, the lens-portion 134 includes a light incident surface 134a, a light emitting surface 134b that is relative to the light incident surface 134a, and a first side surface 134c and a second side surface 134d that are connecting the upper surface 132a and the light emitting surface 134b. The light incident surface 134a is a curved surface concaving towards the light emitting surface 134b. In addition, the first side surface 134c is a plane and the second side surface 134d is a curved surface.

In the present embodiment, the light emitting element 120 is suitable for emitting a light beam L. Moreover, a first partial beam L1 of the light beam L passes through the light incident surface 134a and leaves from the light emitting surface 134b. A second partial beam L2 of the light beam L passes through the light incident surface 134a and is transmitted to the first side surface 134c or the second side surface 134d. The first side surface 134c or the second side surface 134d is suitable for reflecting at least a part of the second partial beam L2 of the light beam L to be passed through the light emitting surface 134b. In other words, after the second partial beam L2 enters the lens-portion 134 through the light incident surface 134a, a part of the second partial beam L2 is reflected by the first side surface 134c or the second side surface 134d, and passes through the light emitting surface 134b. However, another part of the second partial beam L2 is refracted and passes through the light emitting surface 134b. The first side surface 134c or the second side surface 134d reflects a part of the second partial beam L2 of the light beam L to change a transmission path of a part of the second partial beam L2. Therefore, a part of the second partial beam L2 that has been reflected by the first side surface 134c or the second side surface 134d focuses to leave from the lens-portion 134.

Moreover, the flat-portion 132 of the transparent plate 130 of the present embodiment includes the trench 132c. The trench 132c is filled with a waterproof gel layer G for achieving a waterproof effect, so that electronic elements on the light emitting element 120 and the carrier 110 are prevented from being damaged by water, and the electrical quality of the light emitting device 100 can be ensured.

It should be noted that in the present embodiment, a material of the transparent plate 130 is polymethyl methacrylate (PMMA), which has transparency. Moreover, the transparent plate 130 can be adhered on the carrier 110 through adhesion, but the present embodiment is not limited herein. In other embodiment, the transparent plate 130 can also be disposed on the carrier 110 through screwing (not shown) or locking (not shown).

In brief, in the present embodiment, the first partial beam L1 of the light beam L that is emitted by the light emitting element 120 passes through the light incident surface 134a and the light emitting surface 134b sequentially to be transmitted to the external environment. On the other hand, the second partial beam L2 of the light beam L passes through the light incident surface 134a, and is transmitted to the first side surface 134c or the second side surface 134d. The first side surface 134c or the second side surface 134d is suitable for reflecting at least a part of the second partial beam L2 to be passed through the light emitting surface 134b and transmitted to the external environment. In the process, a curvature of the light emitting surface 134b and a curvature of the light incident surface 134a of the transparent plate 130 are different. In addition, the first side surface 134c or the second side surface 134d allows a part of the second partial beam L2 to focus. Therefore, when the light beam L, which is emitted by the light emitting element 120, passes the secondary optical effect of the transparent plate 130 and is transmitted to the external environment, not only are the light emitting efficiency and light intensity of the light emitting device 100 enhanced, but the light emitting uniformity thereof is also enhanced. Additionally, the transparent plate 130 further controls the illuminance distribution of the light emitting element 120 while preventing the occurrence of glares and double visions, so that the light emitting device 100 can obtain a better illumination effect.

Figure 1D:
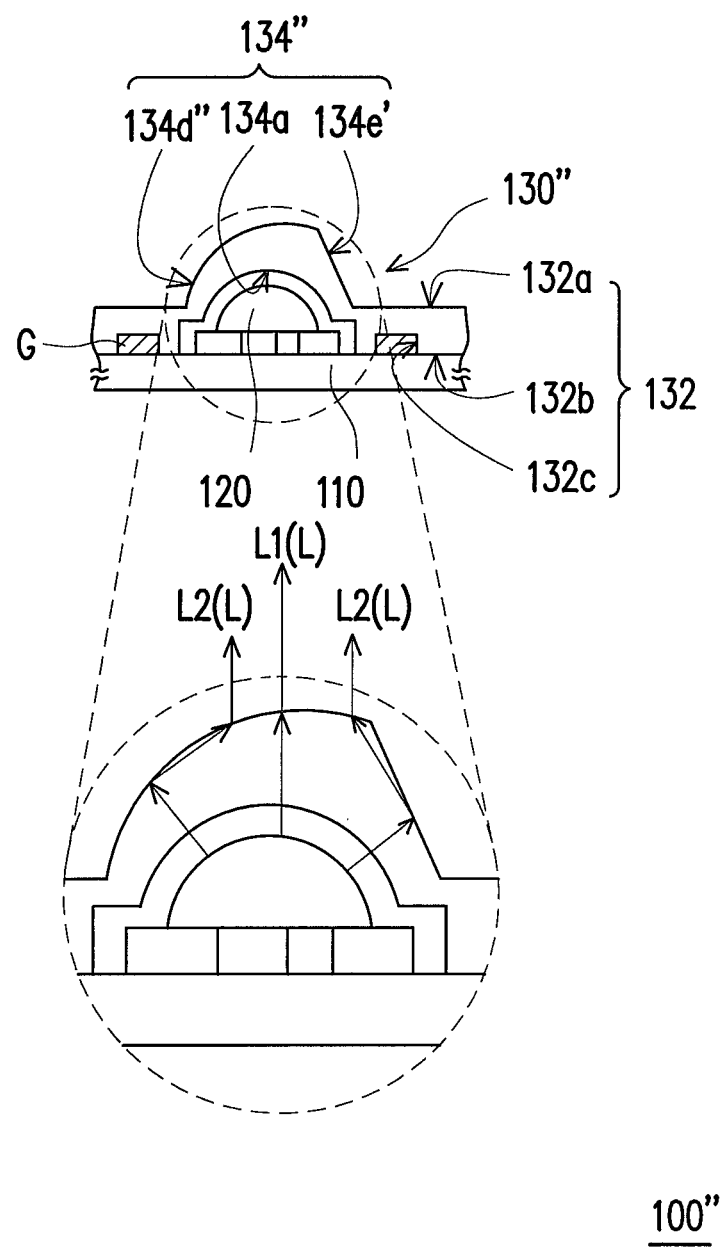
FIG. 1D is a schematic side view of a light emitting device according to another embodiment of the present invention.

It should be noted that in other embodiments, as illustrated in FIG. 1D, a lens-portion 134" includes a light incident surface 134a, and a positive camber 134d" and a side surface 134e' that are connected to a upper surface 132a. Here, a curvature of the positive camber 134d" and a curvature of the light incident surface 134a are substantially different. Specifically, the lens-portion 134" of a transparent plate 130" in the present embodiment applies an optical simulation method to design the curvatures of the positive camber 134d" and the light incident surface 134a. Thus, in the process of the light beam L, which is emitted by a light emitting element 120, to pass through the light incident surface 134a and the positive camber 134d", as the light incident surface 134a and the positive camber 134d" have curvatures that are substantially different, the light emission uniformity of the light emitting element 120 can be enhanced. Furthermore, as the transparent plate 130" includes the side surface 134e', a light emitting device 100" not only controls the illuminance distribution of the light emitting element 120 through the side surface 134e', but also increases the light emitting quantity of the light emitting element 120 to enhance the light emitting efficiency of the light emitting element 120 and thereby enhancing the light emitting brightness of a light emitting device 100". Furthermore, the occurrence of glares and double visions is prevented for the light emitting device 100" to obtain a better illumination effect.

Figure 2A:
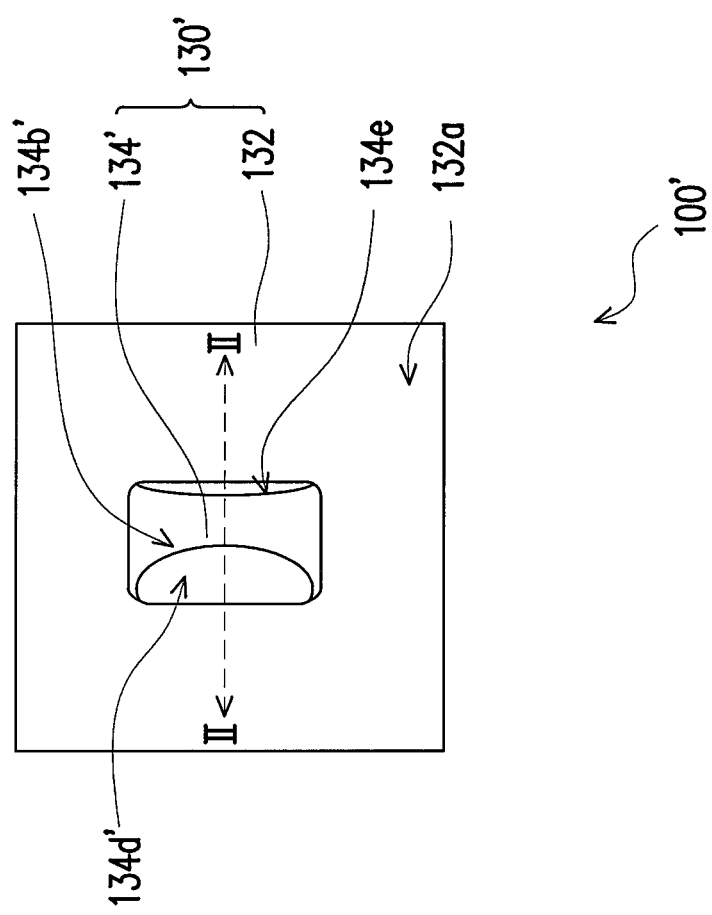
FIG. 2A is a schematic top view of a light emitting device according to another embodiment of the present invention.
Figure 2B:
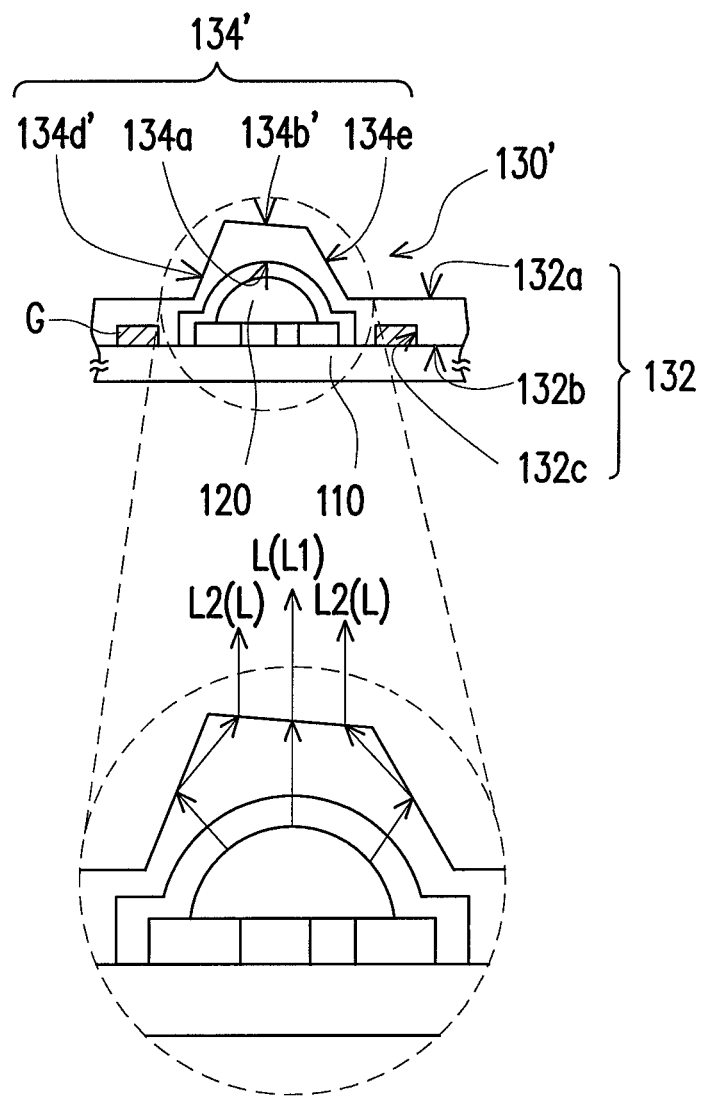
FIG. 2B is a schematic side view taken along line II-II in FIG. 2A.
Figure 2C:
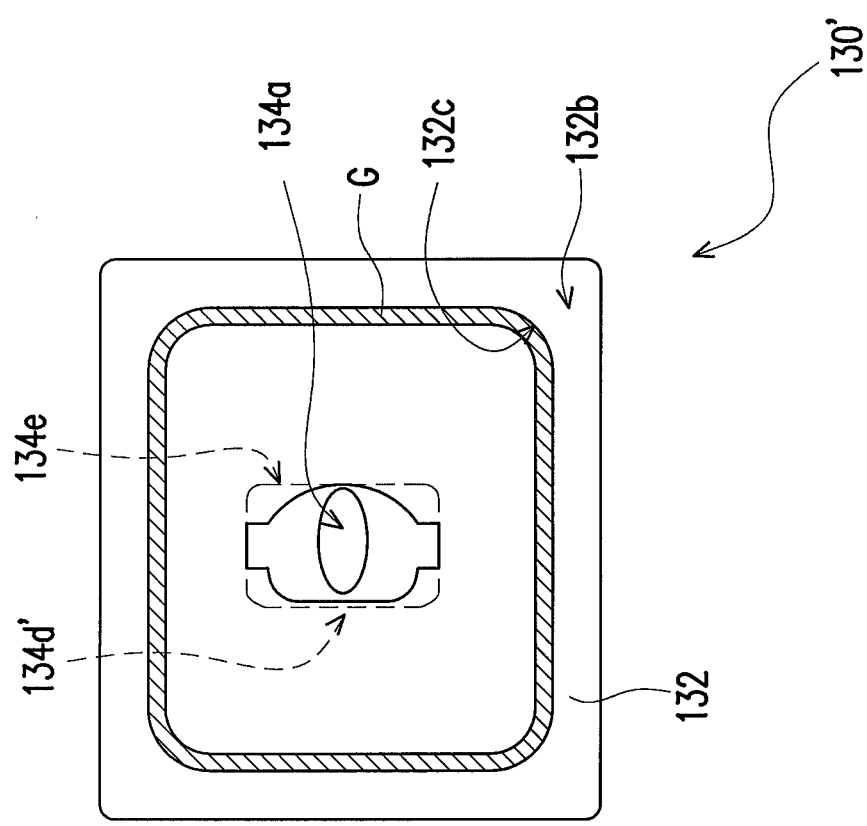
FIG. 2C is a schematic back-side view of the transparent plate depicted in FIG. 2A.

FIG. 2A is a schematic top view of a light emitting device according to another embodiment of the present invention. FIG. 2B is a schematic side view taken along line II-II in FIG. 2A. FIG. 2C is a schematic back-side view of the transparent plate depicted in FIG. 2A. Referring to FIG. 2A, FIG. 2B, and FIG. 2C simultaneously, in the present embodiment, a light emitting device 100' in FIG. 2A is similar to the light emitting device 100 in FIG. 1A. However, the main difference between the two is that in a transparent plate 130' of the light emitting device 100' in FIG. 2A, a transparent portion 134' thereof includes a light emitting surface 134b' which is relative to a light incident surface 134a, and a first side surface 134e and a second side surface 134d' that are opposite to each other and connecting a upper surface 132a and the light emitting surface 134b'. Herein, the first side surface 134d' and the second side surface 134e are each a plane, and the light incident surface 134a is a curved surface concaving towards the light emitting surface 134b'.

In details, tilting angles of the first side surface 134e and the second side surface 134d' relative to the upper surface 132a are substantially different. In other words, a slope of the first side surface 134e and a slope of the second side surface 134d' are different, but the present embodiment is not limited thereto. Obviously, in other embodiments that are not shown, the slopes of the first side surface 134e and the second side surface 134d' can also be the same. In the present embodiment, the light emitting element 120 is suitable for emitting a light beam L. Moreover, a first partial beam L1 of the light beam L passes through the light incident surface 134a and leaves from the light emitting surface 134b'. A second partial beam L2 of the light beam L passes through the light incident surface 134a and is transmitted to the first side surface 134e or the second side surface 134d'. The first side surface 134e or the second side surface 134d' reflects at least a part of the second partial beam L2 of the light beam L to be passed through the light emitting surface 134b'.

It must be illustrated that the slopes of the first side surface 134e and the second side surface 134d' are different. Moreover, the first side surface 134e and the second side surface 134d' are used to reflect a part of the second partial beam L2 of the light beam L for changing a transmission path of a part of the second partial beam L2. Hence, a part of the partial beam L2 that is reflected by the first side surface 134e and the second side surface 134d' then focuses. Furthermore, the light emitting device 100' controls the illuminance distribution of the light emitting element 120 through the first side surface 134e and the second side surface 134d'. At the same time, the occurrence of glares and double visions is prevented so that the light emitting device 100' can obtain a better illumination effect.

Besides, in the present embodiment, the lens-portion 134' applies the optical simulation method to design the curvatures of the light emitting surface 134b' and the light incident surface 134a. Therefore, when the light beam L, which is emitted by the light emitting element 120, passes through the secondary optical effect of the light incident surface 134a and the light emitting surface 134b' of the transparent plate 130', and is transmitted to the external environment, not only is the light emitting quantity of the light emitting element 120 increased to enhance the light emitting efficiency thereof, but the light emitting intensity and light uniformity of the light emitting device 100' can also be enhanced for the light emitting device 100' to obtain a better illumination effect.

Figure 3A:
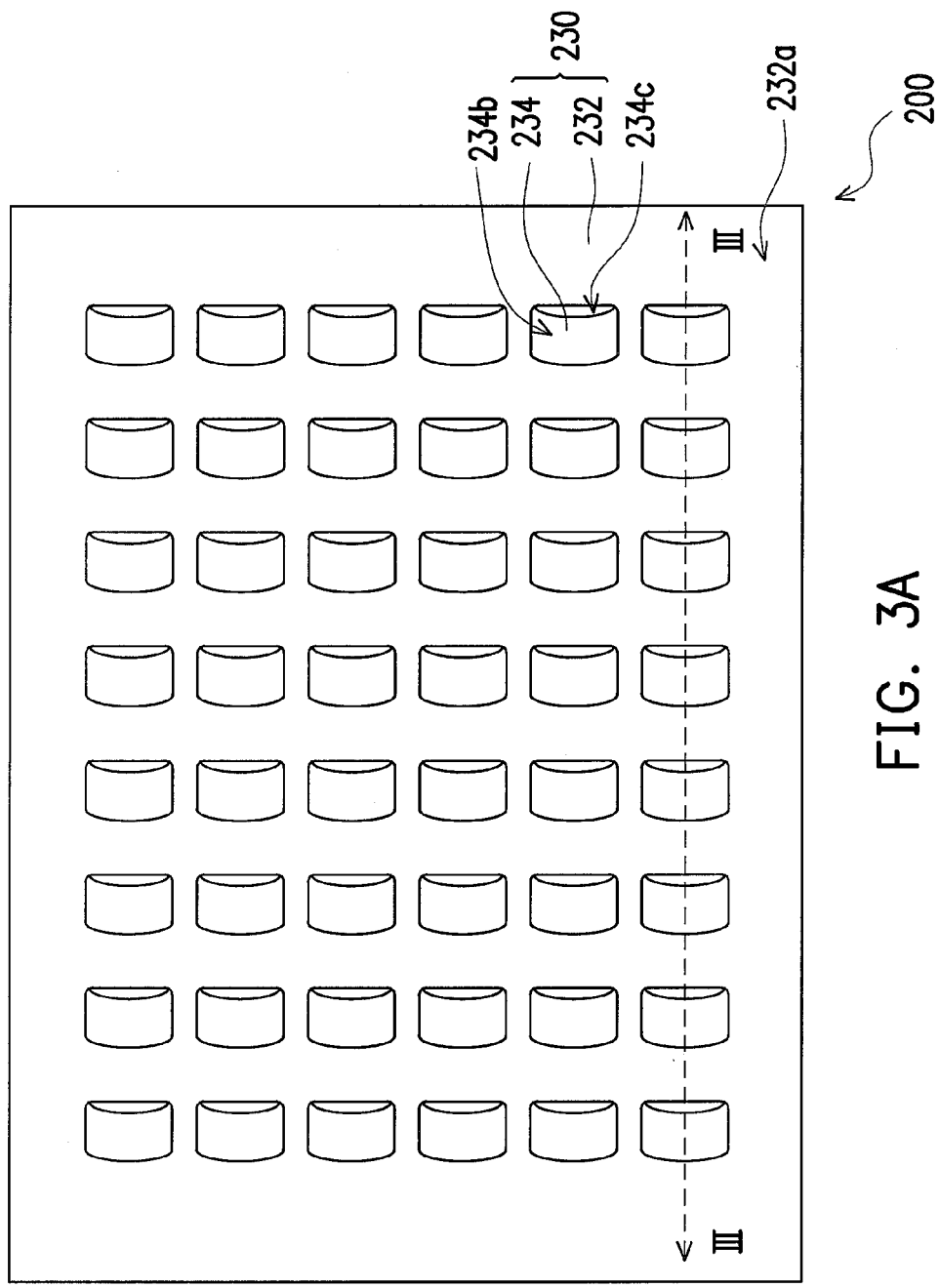
FIG. 3A is a schematic top view of a light source module according to an embodiment of the present invention.
Figure 3B:
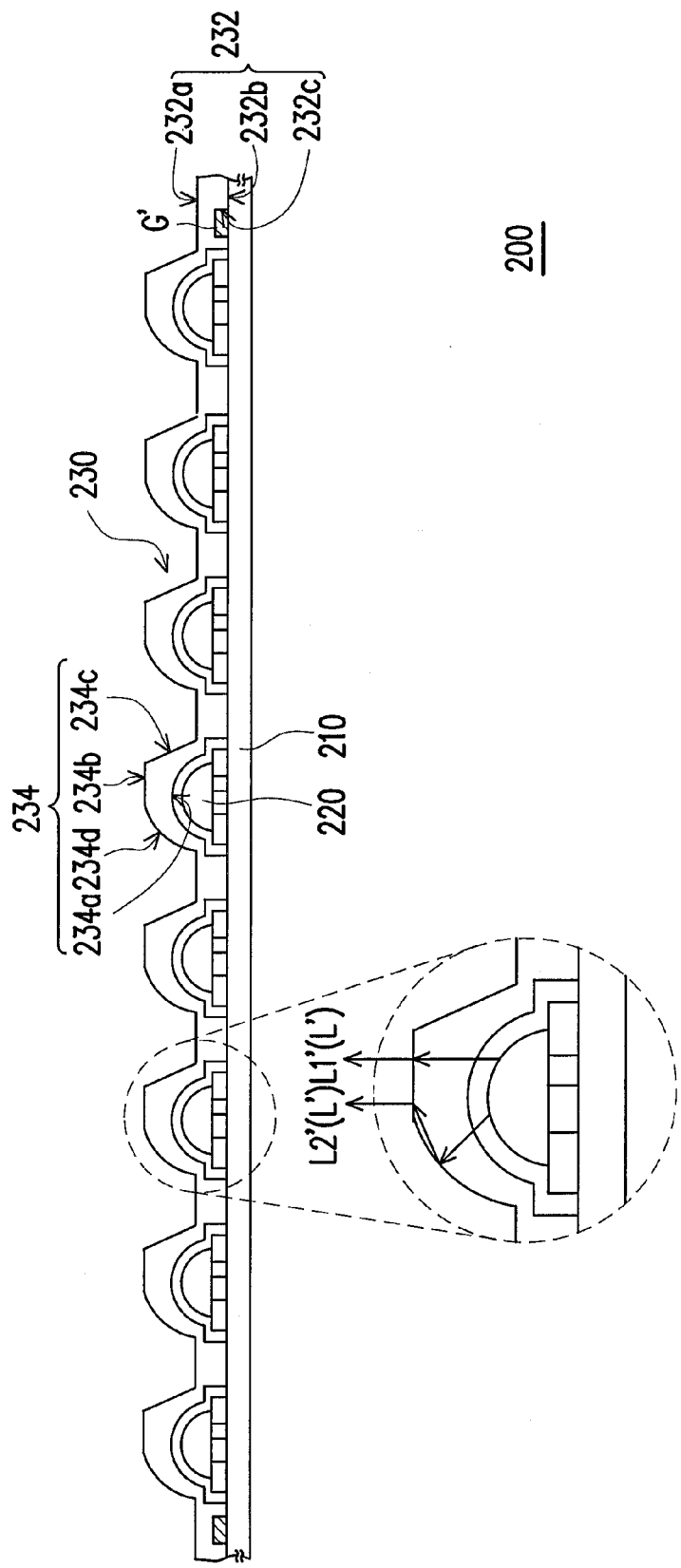
FIG. 3B is a schematic side view taken along line in FIG. 3A.
Figure 3C:
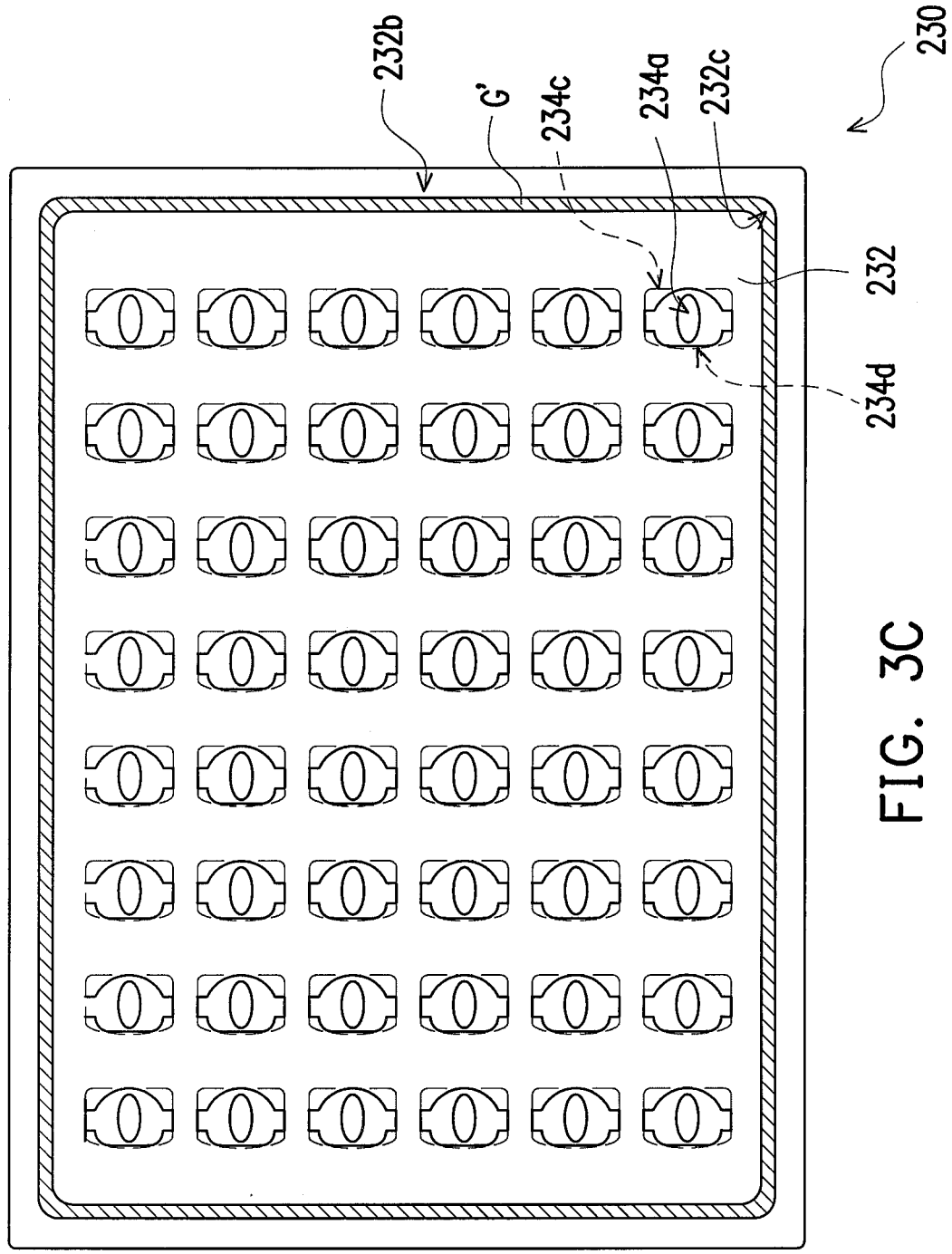
FIG. 3C is a schematic back-side view of the transparent plate depicted in FIG. 3A.
Figure 3D:
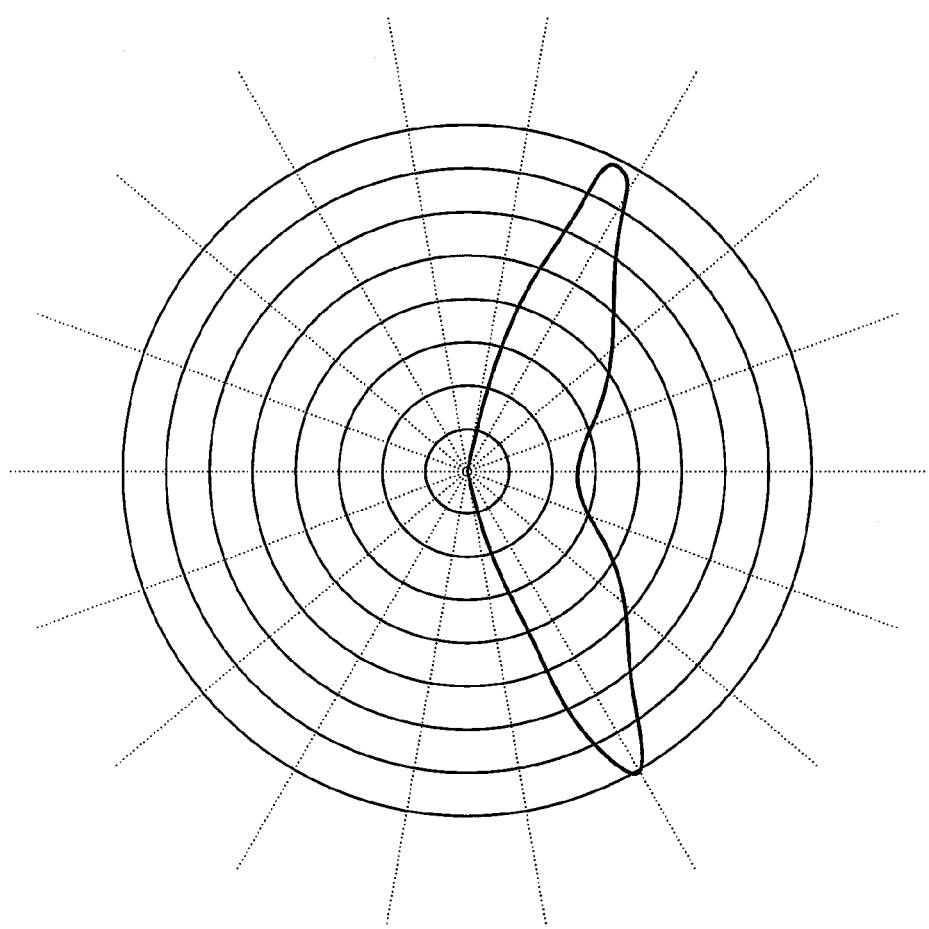
FIG. 3D is a schematic diagram of the light intensity distribution of the light source module depicted in FIG. 3A.

FIG. 3A is a schematic top view of a light source module according to an embodiment of the present invention. FIG. 3B is a schematic side view taken along line in FIG. 3A. FIG. 3C is a schematic back-side view of the transparent plate depicted in FIG. 3A. FIG. 3D is a schematic diagram of the light intensity distribution of the light source module depicted in FIG. 3A. Referring to FIG. 3A, FIG. 3B, and FIG. 3C simultaneously, in the present embodiment, a light source module 200 includes a carrier 210, a plurality of light emitting elements 220, and a transparent plate 230.

In details, the light emitting elements 220 are disposed and electrically connected to the carrier 210. Specially, in the present embodiment, the light emitting elements 220 are arranged on the carrier 210 in a manner of an 8×6 area array. Moreover, the light emitting elements 220 are a plurality of SMD LEDs.

The transparent plate 230 is disposed on the carrier 210. In addition, the transparent plate 230 includes a flat-portion 232 and a plurality of lens-portions 234, which is connected to the flat-portion 232. The flat-portion 232 includes an upper surface 232a, a lower surface 232b that is relative to the upper surface 232a, and a trench 232c, which is disposed around the lower surface 232b. Herein, the lower surface 232b of the flat-portion 232 is directly disposed on the carrier 210, and the trench 232c is circularly disposed around the light emitting elements 220. The lens-portions 234 cover the light emitting elements 220 respectively, that is, the lens-portions 234 are also arranged in the manner of an 8×6 area array. More specifically, every lens-portion 234 has a light incident surface 234a, a light emitting surface 234b that is relative to the light incident surface 234a, and a first side surface 234c and a second side surface 234d which are connected to the upper surface 232a. Herein, the first side surface 234c and the second side surface 234d are respectively a plane and a curved surface. The light incident surface 234a is a curved surface concaving towards the light emitting surface 234b.

In the present embodiment, each light emitting element 220 is suitable for emitting a light beam L'. Moreover, a first partial beam L1' of the light beam L' passes through the light incident surface 234a and leaves from the light emitting surface 234b. A second partial beam L2' of the light beam L' passes through the light incident surface 234a and is transmitted to the first side surface 234c or the second side surface 234d. The first side surface 234c or the second side surface 234d is suitable for reflecting at least a part of the second partial beam L2' to be passed through the light emitting surface 234b. In other words, after the second partial beam L2' enters the lens-portion 234 through the light incident surface 234a, a part of the second partial beam L2' is reflected by the first side surface 234c or the second side surface 234d, and passes through the light emitting surface 234b. On the other hand, another part of the second partial beam L2' is refracted. The first side surface 234c or the second side surface 234d reflects a part of the second partial beam L2' of the light beam L' to change a transmission path of a part of the second partial beam L2'. Therefore, a part of the second partial beam L2' that has been reflected by the first side surface 234c or the second side surface 234d focuses.

Particularly, as every lens-portion 234 of the transparent plate 230 includes the first side surface 234c and the second side surface 234d, the light source module 200 not only controls the illuminance distribution and the light intensity distribution (refer to FIG. 3D) of the light emitting elements 220 through the first side surface 234c and the second side surface 234d, but also increases the light emitting quantity of the light emitting elements 220 to enhance the light emitting efficiency of the light emitting elements 220 and thereby enhancing the light emitting brightness of the light source module 200. Furthermore, the occurrence of glares and double visions is prevented for the light source module 200 to obtain a more uniformed planar light source for achieving a better illumination effect. Moreover, the flat-portion 232 of the transparent plate 230 of the present embodiment includes the trench 232c. The trench 232c is filled with a waterproof gel layer G' for achieving a waterproof effect, so that electronic elements on the light emitting elements 220 and the carrier 210 are prevented from being damaged by water, and the electrical quality of the light source module 200 can be ensured.

It should be noted that in the present embodiment, a material of the transparent plate 230 is PMMA, which includes transparency. Moreover, the transparent plate 230 can be adhered to the carrier 210 through adhesion, but the present embodiment is not limited herein. In other embodiments, the transparent plate 230 can also be disposed on the carrier 210 through screwing (not shown) or locking (not shown). Furthermore, it must be illustrated that the present invention does not limit the number and the arranging manner of the light emitting elements 220. Although the light emitting elements 220 herein are specifically arranged in the manner of the 8×6 area array, however, in other embodiments, the number and the arranging manner of the light emitting elements 220 can be modified based on demand. That is, the number of the light emitting elements 220 may be increased or decreased, and the arranging manner may be altered to change the brightness of the planar light source and the light intensity distribution. The aforesaid method would still be a part of the technical proposal of the present invention and not departing from the protection range of the present invention.

In short, in the present embodiment, the first partial beams L1' of the light beams L' that are respectively emitted by the light emitting elements 220 pass through the light incident surface 234a and the light emitting surface 234b sequentially to be transmitted to the external environment. On the other hand, the second partial beams L2' of the light beams L' pass through the light incident surface 234a, and are transmitted to the first side surface 234c or the second side surface 234d. The first side surface 234c or the second side surface 234d is suitable for reflecting at least a part of the second partial beam L2' to be passed through the light emitting surface 234b and transmitted to the external environment. In the process, a curvature of the light emitting surface 234b and a curvature of the light incident surface 234a are different. In addition, the first side surface 234c or the second side surface 234d allows a part of the second partial beam L2' to focus. Therefore, when the light beams L', which are emitted respectively by the light emitting elements 220, pass through the secondary optical effect of the transparent plate 230 and are transmitted to the external environment, not only are the light emitting efficiency and light intensity of the light source module 200 enhanced, but the light emitting uniformity of the light source module 200 is also enhanced. Additionally, the transparent plate 230 further controls the illuminance distribution and the light intensity distribution of the light emitting elements 220 while preventing the occurrence of glares and double visions, so that the light source module 200 can obtain a better illumination effect.

Figure 4A:
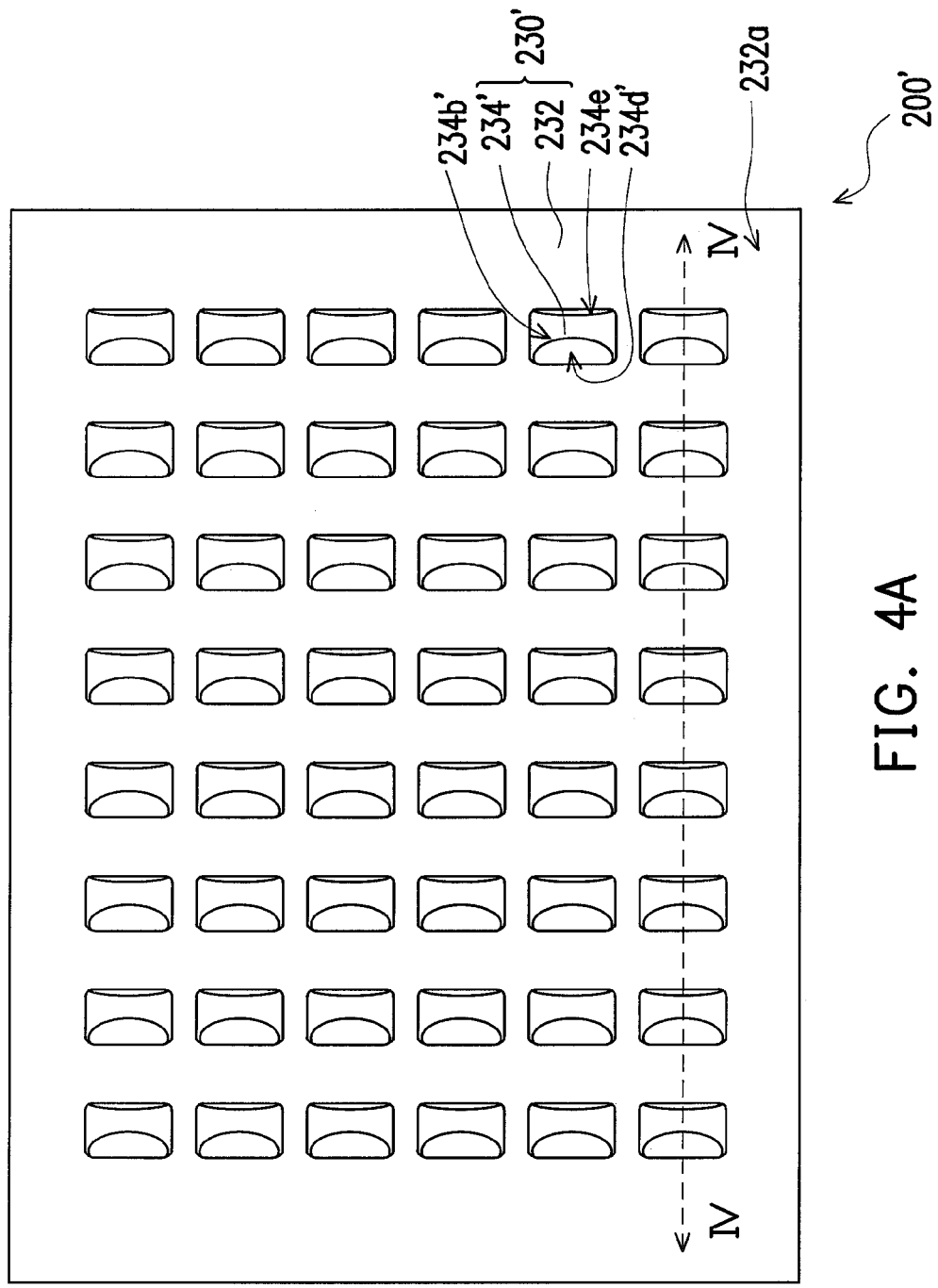
FIG. 4A is a schematic top view of a light source module according to another embodiment of the present invention.
Figure 4B:
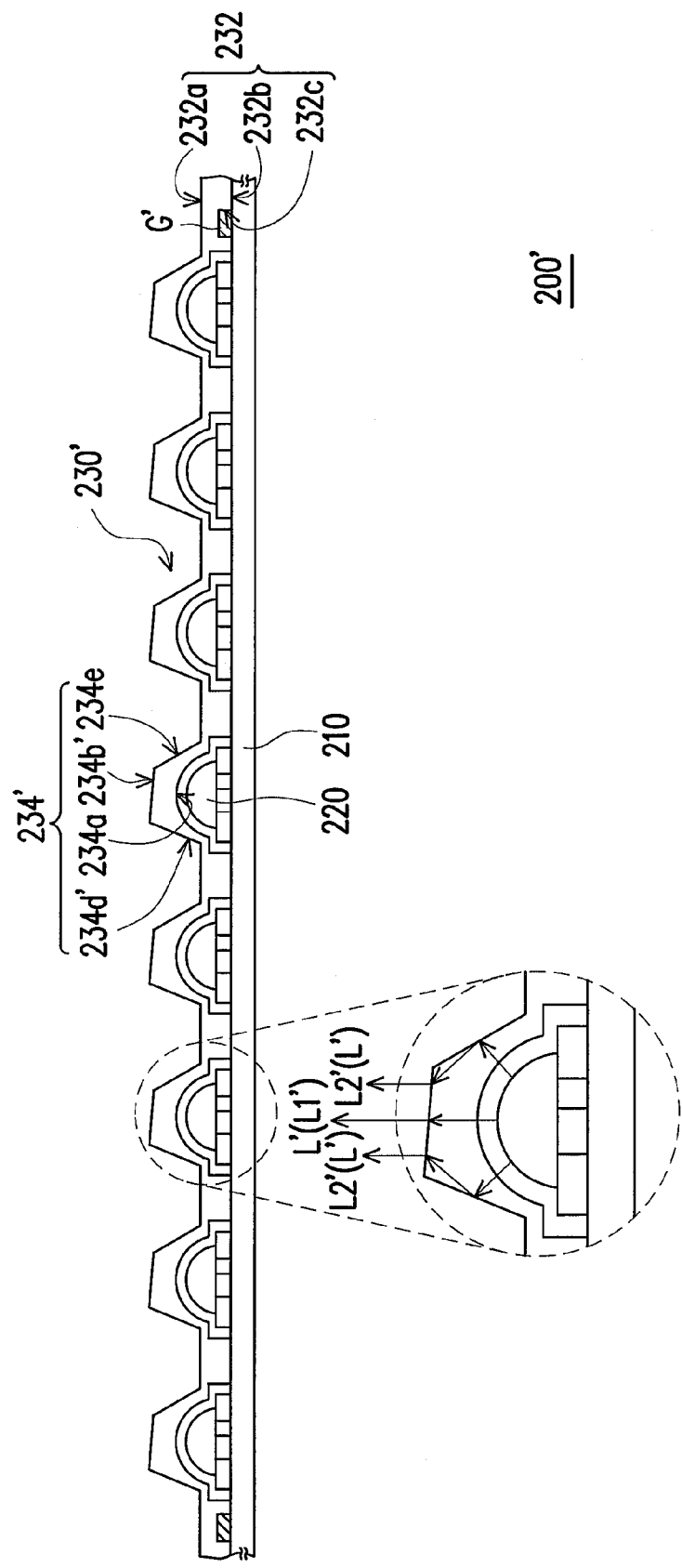
FIG. 4B is a schematic side view taken along line IV-IV in FIG. 4A.
Figure 4C:
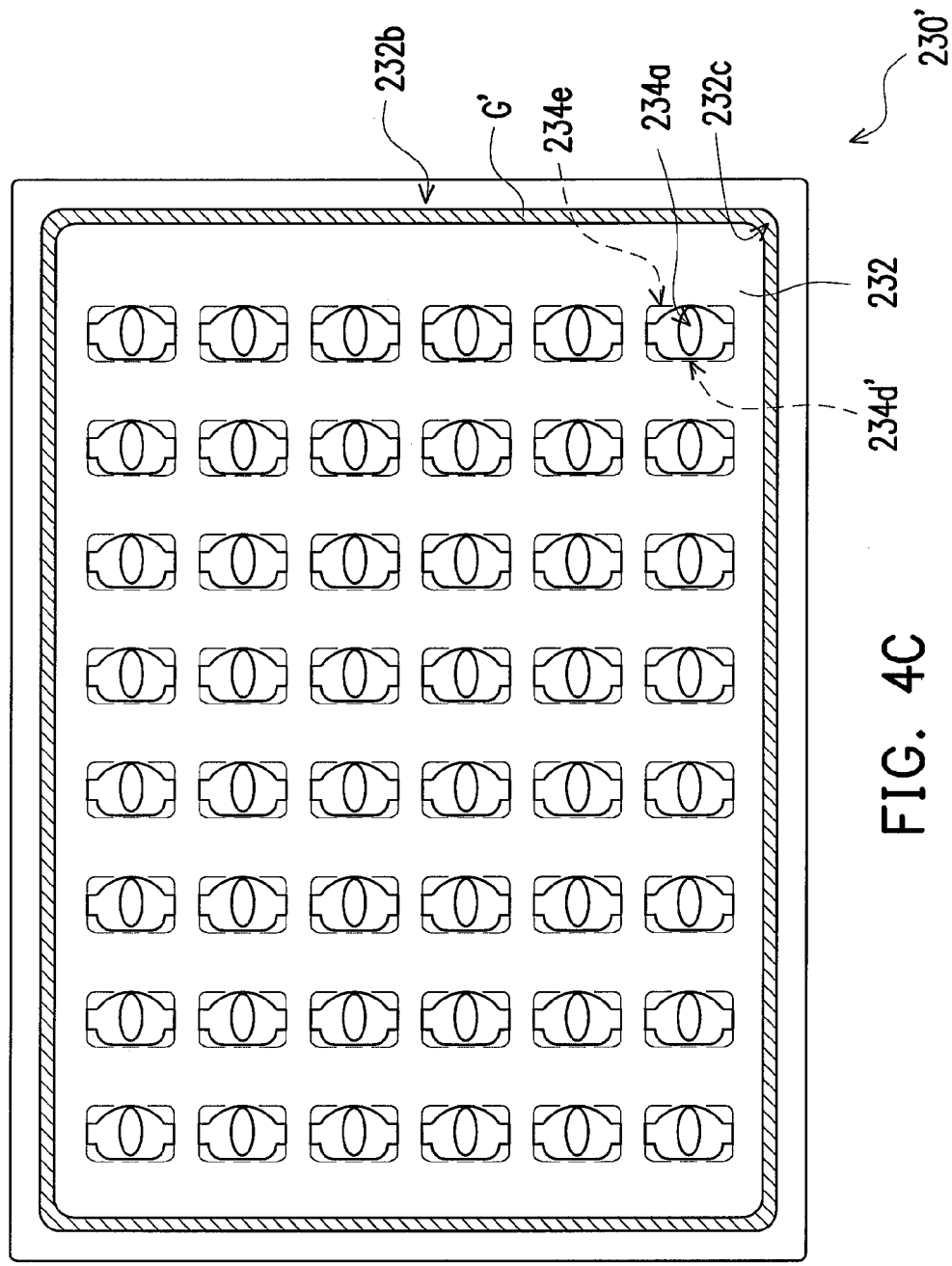
FIG. 4C is a schematic back-side view of the transparent plate depicted in FIG. 4A.
Figure 4D:
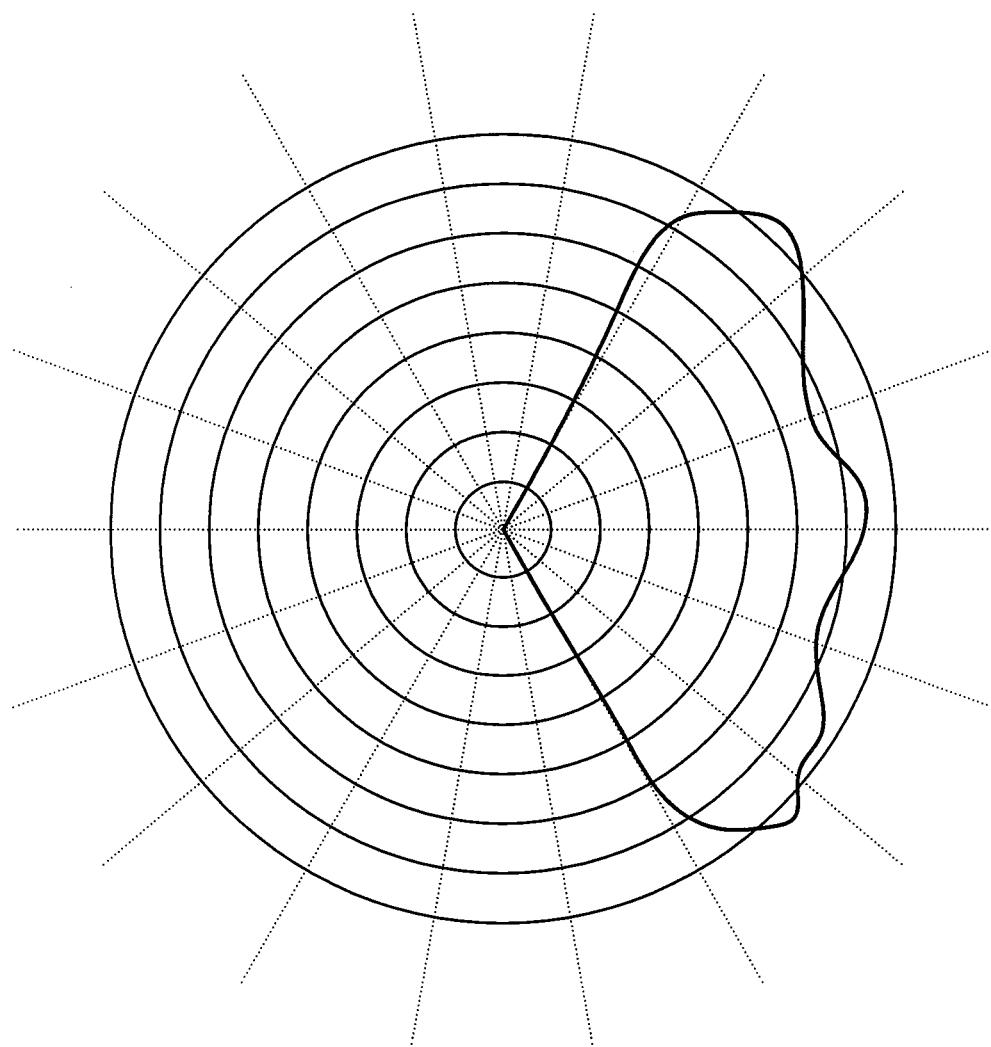
FIG. 4D is a schematic diagram of the light intensity distribution of the light source module depicted in FIG. 4A.

FIG. 4A is a schematic top view of a light source module according to another embodiment of the present invention. FIG. 4B is a schematic side view taken along line IV-IV in FIG. 4A. FIG. 4C is a schematic back-side view of the transparent plate depicted in FIG. 4A. FIG. 4D is a schematic diagram of the light intensity distribution of the light source module depicted in FIG. 4A. Referring to FIG. 4A, FIG. 4B, and FIG. 4C simultaneously, in the present embodiment, a light source module 200' in FIG. 4A is similar to the light source module 200 in FIG. 2A. However, the main difference between the two is that in a transparent plate 230' of the light source module 200' in FIG. 4A, a lens-portion 234' thereof includes a light emitting surface 234b' relative to the light incident surface 234a, and a first side surface 234e and a second side surface 234d' that are opposite to each other and connecting the upper surface 232a and the light emitting surface 234b'. Herein, the first side surface 234e and the second side surface 234d' are each a plane, and the light incident surface 234a is a curved surface concaving towards the light emitting surface 234b'.

In more detail, tilting angles of the first side surface 234e and the second side surface 234d' relative to the upper surface 232a are substantially different. In other words, a slope of the first side surface 234e and a slope of the second side surface 234d' are different, but the present embodiment is not limited thereto. Obviously, in other embodiments, the slopes of the first side surface 234e and the second side surface 234d' can also be the same. In the present embodiment, each light emitting element 220 is suitable for emitting a light beam L'. Moreover, a first partial beam L1' of the light beam L' passes through the light incident surface 234a and leaves from the light emitting surface 234b'. A second partial beam L2' of the light beam L' passes through the light incident surface 234a and is transmitted to the first side surface 234e or the second side surface 234d'. The first side surface 234e or the second side surface 234d' reflects at least a part of the second partial beam L2' to be passed through the light emitting surface 234b'.

The slopes of the first side surface 234e and the second side surface 234d' are different. Moreover, the first side surface 234e and the second side surface 234d' are used to reflect a part of the second partial beam L2' in the light beam L' for changing a transmission path a part of the second partial beam L2'. Hence, a part of the partial beam L2' that is reflected by the first side surface 234e and the second side surface 234d' then focuses. Additionally, the light source module 200' can control the illuminance distribution and the light intensity distribution (shown in FIG. 4D) of the light emitting elements 220 through the first side surface 234e and the second side surface 234d'. At the same time, the occurrence of glares and double visions is also prevented, so that the light source module 200' obtains a more uniformed planar light source for achieving a better illumination effect.

Besides, in the present embodiment, the lens-portion 234' applies the optical simulation method to design the curvatures of the light emitting surface 234b' and the light incident surface 234a. Therefore, when the light beams L', which are emitted by the light emitting elements 220, pass through the secondary optical effect of the light incident surface 234a and the light emitting surface 234b' of the transparent plate 230', and are transmitted to the external environment, not only is the light emitting quantity of the light emitting elements 220 increased to enhance the light emitting efficiency thereof, but the light emitting intensity and light uniformity of the light source module 200' can also be enhanced for the light source module 200' to obtain a better illumination effect.

In summary, the light emitting devices of the present invention all cover the light emitting elements through the lens-portions of the transparent plates, so that the first partial beams of the light beams emitted by the light emitting elements sequentially pass through the light incident surfaces and the light emitting surfaces or the positive cambers with different curvatures. The second partial beams of the light beams pass through the light incident surface and are transmitted to the side surfaces, the first side surfaces or the second side surfaces. Moreover, the side surfaces, the first surfaces or the second side surfaces reflect at least a part of the second partial beams to be passed through the light emitting surfaces or the positive cambers. Hence, not only are the light intensities and the light emitting uniformities of the light emitting devices increased, but the illuminance distributions and the light intensity distributions can also be controlled through the side surfaces, the first side surfaces or the second side surfaces. At the same time, the occurrence of glares and double visions is also prevented for the light emitting devices to achieve a better illumination effect. In addition, in the present invention, the flat-portion of the transparent plate has the trench, which allows the light emitting elements and the electronic elements on the carrier to be waterproof for ensuing the electrical quality of the light emitting devices.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A light emitting device, comprising:
   a carrier;
   a light emitting element, disposed on the carrier and electrically connected to the carrier; and
   a transparent plate, disposed on the carrier, the transparent plate comprising:
      a flat-portion, having an upper surface and a lower surface relative to the upper surface, and the lower surface directly disposed on the carrier;
      a lens-portion, covering the light emitting element, and having a light incident surface, a light emitting surface relative to the light incident surface, a first side surface connecting the upper surface and the light emitting surface and a second side surface opposite to the first side surface and connecting the upper surface and the light emitting surface, a slope of the first side surface and a slope of the second side surface being substantially different, wherein at least one of the first side surface and the second side surface is a plane surface,
   wherein the light emitting element is suitable for emitting a light beam, a first partial beam of the light beam passes through the light incident surface and leaves from the light emitting surface, a second partial beam of the light beam passes through the light incident surface and is transmitted to the first side surface or the second side surface, and the first side surface or the second side surface reflects at least a part of the second partial beam of the light beam to be passed through the light emitting surface.

2. The light emitting device as claimed in claim 1, wherein the first side surface and the second side surface are planes.

3. The light emitting device as claimed in claim 2, wherein a tilting angle of the first side surface relative to the upper surface and a tilting angle of the second side surface relative to the upper surface are substantially different.

4. The light emitting device as claimed in claim 1, wherein the first side surface and the second side surface are respectively a plane and a curved surface.

5. The light emitting device as claimed in claim 1, wherein the light incident surface is a curved surface concaving towards the light emitting surface.

6. The light emitting device as claimed in claim 1, wherein a material of the transparent plate comprises polymethyl methacrylate.

7. The light emitting device as claimed in claim 1, wherein the transparent plate is disposed on the carrier by adhering, screwing, or locking.

8. The light emitting device as claimed in claim 1, wherein the flat portion of the transparent plate further comprises a trench which is disposed around the lower surface, and the trench is circularly disposed around the light emitting element.

9. The light emitting device as claimed in claim 8, wherein a waterproof gel layer is disposed within the trench.

10. The light emitting device as claimed in claim 1, wherein the light emitting element comprises a surface mount device (SMD) light emitting diode (LED).

11. A light emitting device, comprising:
   a carrier;
   a light emitting element, disposed on the carrier and electrically connected to the carrier;
   a transparent plate, disposed on the carrier, the transparent plate comprising:
      a flat-portion, having an upper surface and a lower surface relative to the upper surface, the lower surface directly disposed on the carrier;
      a lens-portion, covering the light emitting element, having a light incident surface and a plane surface and a positive camber connected to the upper surface, a curvature of the plane surface and a curvature of the positive camber being substantially different,
   wherein the light emitting element is suitable for emitting a light beam, a first partial beam of the light beam passes through the light incident surface and leaves the positive camber, a second partial beam of the light beam passes through the light incident surface and is transmitted to the plane surface, and the plane surface reflects at least a part of the second partial beam of the light beam to be passed through the positive camber.

12. The light emitting device as claimed in claim 11, wherein the light incident surface is a curved surface concaving towards the positive camber.

13. The light emitting device as claimed in claim 11, wherein a curvature of the light incident surface and a curvature of the positive camber are substantially different.

14. The light emitting device as claimed in claim 11, wherein a material of the transparent plate comprises polymethyl methacrylate.

15. The light emitting device as claimed in claim 11, wherein the transparent plate is disposed on the carrier by adhering, screwing, or locking.

16. The light emitting device as claimed in claim 11, wherein the flat portion of the transparent plate further comprises a trench which is disposed around the lower surface, and the trench is circularly disposed around the light emitting element.

17. The light emitting device as claimed in claim 16, wherein a waterproof gel layer is disposed within the trench.

18. The light emitting device as claimed in claim 11, wherein the light emitting element comprises a surface mount device (SMD) light emitting diode (LED).

19. A light emitting device, comprising:
   a carrier;
   a light emitting element, disposed on the carrier and electrically connected to the carrier; and
   a transparent plate, disposed on the carrier, the transparent plate comprising:
      a flat-portion, having an upper surface and a lower surface relative to the upper surface, and the lower surface directly disposed on the carrier;
      a lens-portion, covering the light emitting element, and having a light incident surface, a light emitting surface relative to the light incident surface, a first side surface connecting the upper surface and the light emitting surface and a second side surface opposite to the first side surface and connecting the upper surface and the light emitting surface, a slope of the first side surface and a slope of the second side surface being substantially different, wherein at least one of the first side surface and the second side surface is a plane surface.

* * * * *